(12) United States Patent
Hakamada

(10) Patent No.: US 6,861,786 B2
(45) Date of Patent: Mar. 1, 2005

(54) SAW DEVICE

(75) Inventor: Shinichi Hakamada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 187 days.

(21) Appl. No.: 10/173,944

(22) Filed: Jun. 19, 2002

(65) Prior Publication Data

US 2002/0195675 A1 Dec. 26, 2002

(30) Foreign Application Priority Data

Jun. 22, 2001 (JP) .......................................... 2001-190484
Jan. 21, 2002 (JP) .......................................... 2002-011036

(51) Int. Cl.$^7$ .............................................. H01L 41/047
(52) U.S. Cl. ........................................ 310/364; 310/363
(58) Field of Search .................................. 310/363, 364

(56) References Cited

U.S. PATENT DOCUMENTS

| | | | | |
|---|---|---|---|---|
| 4,472,652 A | * | 9/1984 | Brice et al. ............. | 310/313 B |
| 5,844,347 A | | 12/1998 | Takayama et al. ...... | 310/313 R |
| 6,316,860 B1 | * | 11/2001 | Kimura et al. .......... | 310/313 A |
| 6,580,198 B2 | * | 6/2003 | Nakano et al. ......... | 310/313 R |
| 2002/0047495 A1 | * | 4/2002 | Nakano et al. ......... | 310/313 R |
| 2003/0111936 A1 | * | 6/2003 | Matsuo et al. ............... | 310/363 |
| 2003/0122453 A1 | * | 7/2003 | Yamada et al. .............. | 310/363 |

FOREIGN PATENT DOCUMENTS

| | | | | |
|---|---|---|---|---|
| JP | 1-277011 | * | 11/1989 | ................. 29/25.35 |
| JP | 04-294625 | * | 10/1992 | ......... H03H/9/145 |
| JP | 4-369915 | * | 12/1992 | ............ H03H/9/25 |
| JP | 09-69748 | | 3/1997 | ......... H03H/9/145 |
| JP | 09-199976 | | 7/1997 | ......... H03H/9/145 |
| JP | 9-294044 | * | 11/1997 | ......... H03H/9/145 |
| JP | 10-163800 | * | 6/1998 | ............ H03H/9/25 |

* cited by examiner

Primary Examiner—Thomas M. Dougherty
(74) Attorney, Agent, or Firm—Volentine Francos & Whitt, PLLC

(57) ABSTRACT

A SAW device includes a piezoelectric substrate, and an electrode having a first metal film which is formed over the piezoelectric substrate and is made with a first material, and second metal films which are formed over side walls of the first metal film and are made with a second material which is different from the first material.

10 Claims, 10 Drawing Sheets

SAW DEVICE

CROSS REFERENCE TO RELATED APPLICATION

The present application claims priority under 35 U.S.C. §119 to Japanese Patent Application Nos. 2001-190484, filed Jun. 22, 2001 and 2002-11036, filed Jan. 21, 2002, which are herein incorporated by reference in their entirety for all purposes.

BACKGROUND OF THE INVENTION

1. Field of the Invention

The present invention relates to a surface acoustic wave (SAW) device, and more particularly to a metal electrode of a SAW device, for example, an inter-digital transducer (IDT) electrode made of a comb shaped aluminum film formed on the surface of a piezoelectric substrate.

2. Description of the Related Art

A conventional SAW device having an IDT electrode is formed on a piezoelectric substrate (e.g., a $LiTaO_3$ substrate). FIG. 13 is a cross-sectional view of the IDT electrode structure of the conventional SAW device. As shown in FIG. 13, a conductive film 2 (an aluminum film 2) is formed on the piezoelectric substrate 1. A photolithography etching of the conductive film 2 is performed to form the IDT electrode pattern.

FIG. 14 is a cross-sectional view of another IDT electrode structure of the conventional SAW device. As shown in FIG. 14, the IDT electrode is formed as a laminate structure, and includes a conductive film 3, a second conductive film 4, and a third conductive film 5, formed on the piezoelectric substrate 1.

Recently, as mobile communication systems have become to operate at higher frequencies, the operating frequency of SAW devices has increased from hundreds of MHz to several GHz, and the power output demand has increased as well. As a result of the increase in frequency, the pattern width of the IDT electrode must be made finer.

When a large electric power is applied to a SAW device having a fine electrode width, a wrap generated by a surface acoustic wave causes stress on the electrode film. When such a stress exceeds stress limit of the electrode film, aluminum atoms in the electrode film material move in the grain boundary. As a result, hillocks in the electrode and voids of a surface of the electrode are formed, and the characteristics of the SAW device deteriorate. Further, the electrode of the SAW device may be broken due to a short of the electrode.

To prevent hillocks and voids, the conventional SAW device is disclosed in, for example, Japanese Laid-Open Patent Publication: HEI09-199979, published on Jul. 31, 1997. In the conventional SAW device, the aluminum material is used as a main component of the electrode. Also, attempts have been made to reinforce the electrode film by adding, for example, copper (Cu), titanium (Ti), nickel (Ni), magnesium (Mg), palladium (Pd), and so on. Specifically, since copper (Cu) has a low resistance and can withstand a higher stress migration and a higher electrical migration, a copper alloy film including an inorganic protecting film is proposed as the electrode film of the SAW device. At this time, the inorganic protecting film can inhibit an oxidation of the copper, and the inorganic protecting film is, for example, a silicon oxide ($SiO_2$) having a thickness of 2 nm through 30 nm.

However, the propagation properties of the surface acoustic wave are deteriorated due to the inorganic protecting film. Further, it is too difficult to etch the copper effectively.

SUMMARY OF THE INVENTION

The present invention is therefore directed to providing a SAW device and a method of manufacturing the same, which substantially overcome one or more of the problems due to the limitations and disadvantages of the related art.

It is an objective of the invention to provide a semiconductor device and a method of manufacturing the same, in which a piezoelectric substrate including an electrode having a first metal film which is formed over the piezoelectric substrate and is made with a first material, and second metal films which are formed over side walls of the first metal film and are made with a second material which is different from the first material.

According to the present invention, a movement of aluminum atoms in an IDT electrode can be inhibited, and the occurrence of hillocks and voids in the IDT electrode can be inhibited. Therefore, a propagation property of a surface acoustic wave can be improved significantly.

The above and further objects and novel features of the invention will more fully appear from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood.

Figure 1A:
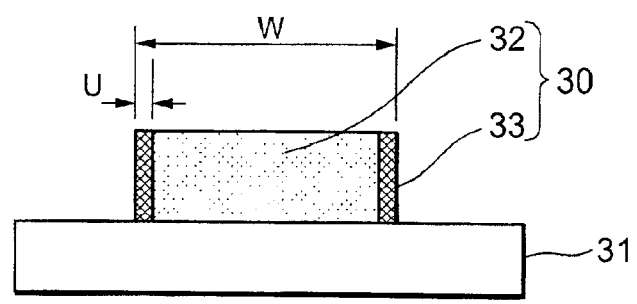
FIG. 1(a) is a cross-sectional view and FIG. 1(b) is a plan view of a SAW device according to a first preferred embodiment of the present invention.
Figure 1B:
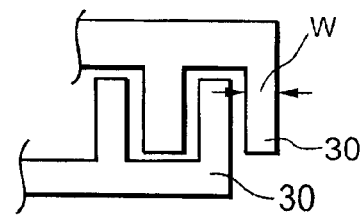

FIG. 1(a) is a cross-sectional view and FIG. 1(b) is a plan view of an IDT electrode 30 of a SAW device according to a first preferred embodiment of the present invention. As shown in FIGS. 1(a) and 1(b), the IDT electrode 30 having a metal film 32 and thin metal films 33 which are formed on both side walls of the metal film 32, is formed on a piezoelectric substrate (e.g., LiTaO$_3$) 31. The metal film 32 is an aluminum alloy including copper (Cu) of 1 weight percent. The thin metal films 33 are, for example, titanium (Ti), and a thickness U of the thin metal films 33 is about 150 Å. The titanium (Ti) is higher in density than a conventional inorganic protection film (e.g., SiO$_2$). A width W of the IDT electrode 30 is about 1.2 μm when the IDT electrode 30 is used in the SAW device having a center frequency in the 800 MHz band, and is about 0.5 μm when the IDT electrode 30 is used to the SAW device having a center frequency in the 2 GHz band. Specifically, as the center frequency of the SAW device is higher, the width of the IDT electrode 30 is more narrow.

While the first embodiment presents an example in which the thickness U of the thin metal films 33 is about 150 Å, it is not limited to this example, and the thickness U of the thin metal films 33 may be equal to or less than 1000 Å.

Figure 2A:
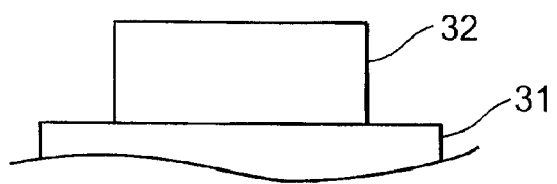
FIGS. 2(a) through 2(c) are cross-sectional views showing a method of manufacturing the SAW device according to the first preferred embodiment of the present invention.
Figure 2B:
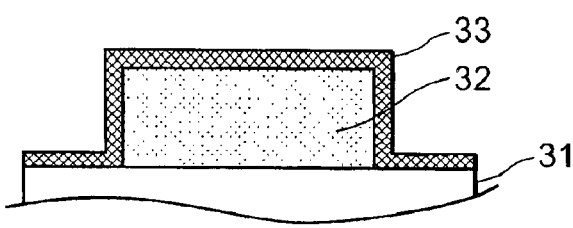
Figure 2C:
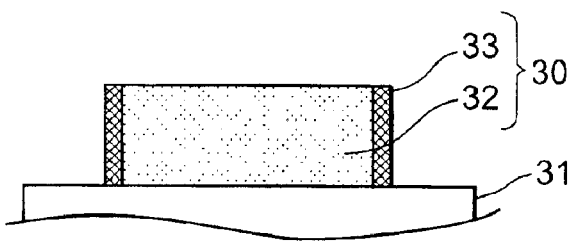

FIGS. 2(a) through 2(c) are cross-sectional views showing a method of manufacturing the IDT electrode 30 of the SAW device according to the first preferred embodiment of the present invention. As shown in FIG. 2(a), the metal film 32, for example, an aluminum alloy film 32 including copper (Cu) of 1 weight percent is formed on the piezoelectric substrate 31 by a magnetron sputtering method. Then, the metal film 32 as an IDT electrode pattern is formed by a photolithography etching method.

Next, as shown in FIG. 2(b), the thin metal film 33 having a thickness U of about 150 Å is formed on the metal film 32 by a magnetron sputtering method.

Next, as shown in FIG. 2(c), the thin metal films 33 are formed on the both side walls of the metal film 32 by an anisotropic etching method, for example, an electron cyclotron resonance (ECR) etching method. Such an ECR etching method is performed using a mixed gas including 50 cc CF$_4$ and 5 cc O$_2$, under 16 mTorr pressure and 300 mA microwave power. At this time, the amount of an over etching is 30 percent.

While the first embodiment presents an example in which the magnetron sputtering method is used to form the metal films 32 and 33, it is not limited to this example, and a deposition method may be used to form the metal films 32 and 33.

While the first embodiment presents an example in which the titanium (Ti) is used as a material of the thin metal films 33, it is not limited to this example, and chromium (Cr), cobalt (Co), molybdenum (Mo), tantalum (Ta), tungsten (W), palladium (Pd), copper (Cu), niobium (Nb), hafnium (Hf), vanadium (V), nickel (Ni), silver (Ag), zirconium (Zr), platinum (Pt) and gold (Au) may be used as a material of the thin metal films 33.

According to the first preferred embodiment of the present invention, since the thin metal films 33 are formed on the both side walls of the metal film 32, a movement of aluminum atoms from an inside to the both side walls of the metal film 32 can be inhibited. Therefore, an occurrence of hillocks at the both side walls of the metal film 32 can be inhibited. Further, since the thin metal film 33 (titanium:Ti) is higher density than a conventional inorganic protection film (e.g., SiO$_2$), the occurrence of hillocks at the both side walls of the metal film 32 can be effectively inhibited. Further, since the metal films 33 are very thin, a propagation property of the surface acoustic wave can be improved significantly than the propagation properties of the surface acoustic wave of the conventional SAW device having a thick inorganic protection film (e.g., SiO$_2$).

Figure 3:
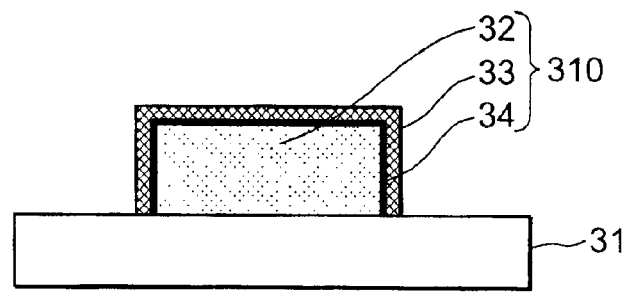
FIG. 3 is a cross-sectional view of a SAW device according to a second preferred embodiment of the present invention.

FIG. 3 is a cross-sectional view of an IDT electrode 310 of a SAW device according to a second preferred embodiment of the present invention. As shown in FIG. 3, the IDT electrode 310 having a metal film 32, a thin metal film 33 which is formed on the metal film 32, and a metal alloy film 34 which is formed between the metal film 32 and the thin metal film 33, is formed on a piezoelectric substrate (e.g., LiTaO$_3$) 31. The metal film 32 is an aluminum alloy including copper (Cu) of 1 weight percent. The thin metal films 33 are, for example, titanium (Ti), a thickness of the thin metal films 33 is about 150 Å. Titanium (Ti) is higher density than a conventional inorganic protection film (e.g., SiO$_2$). The metal alloy film 34 is consisted of the metal film 32 and the thin metal film 33.

Figure 4A:
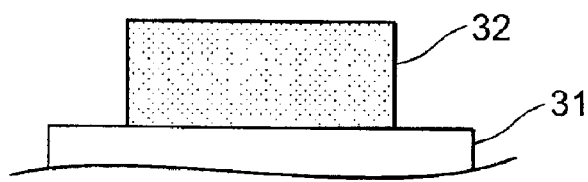
FIGS. 4(a) through 4(d) are cross-sectional views showing a method of manufacturing the SAW device according to the second preferred embodiment of the present invention.

FIGS. 4(a) through 4(d) are cross-sectional views showing a method of manufacturing the IDT electrode 310 of the SAW device according to the second preferred embodiment of the present invention. As shown in FIG. 4(a), the metal film 32, for example, an aluminum alloy film 32 including copper (Cu) of 1 weight percent is formed on the piezoelectric substrate 31 by a magnetron sputtering method. Then, the metal film 32 as an IDT electrode pattern is formed by a photolithography etching method.

Figure 4B:
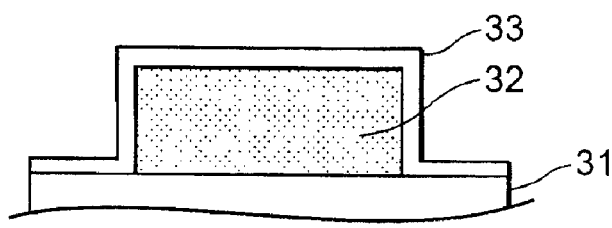

Next, as shown in FIG. 4(b), the thin metal film 33 having a thickness of about 150 Å is formed on the metal film 32 by the magnetron sputtering method.

Figure 4C:
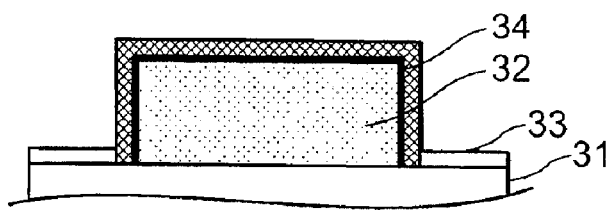

Next, as shown in FIG. 4(c), an annealing is performed to form the metal alloy film 34 at the junctions of the metal film 32 and the thin metal film 33. Such an annealing is performed, in nitride (N$_2$) gas atmosphere, and at 250 temperature (250° C.) and during 1 hour.

Figure 4D:
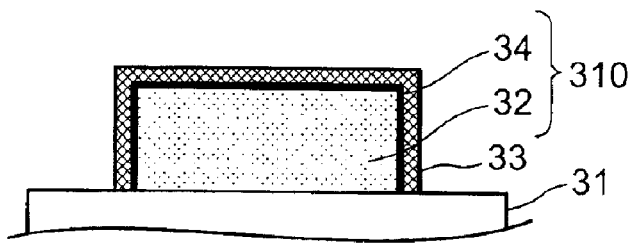

Next, a dry etching method using a fluorocarbon gas is performed. As a result, as shown in FIG. 4(d), a non-reacted region of the thin metal film 33 located on the piezoelectric substrate is removed, and a thickness of the thin metal film 33 located on the metal alloy film 34 reduces.

According to the second preferred embodiment of the present invention, since the top surface and the both side walls of the metal film 32 are covered with the thin metal film 33 and the metal alloy film 34, a movement of aluminum atoms in the metal film 32 can be inhibited. As a result, an occurrence of hillocks and voids in the metal film 32 can be inhibited. Similarly, an occurrence of hillocks at the top surface and the both side walls of the metal film 32 can be inhibited. As a result, since the occurrence of hillocks at the top surface of the metal electrode 32, the fluctuation of frequency can be effectively inhibited.

Figure 5:
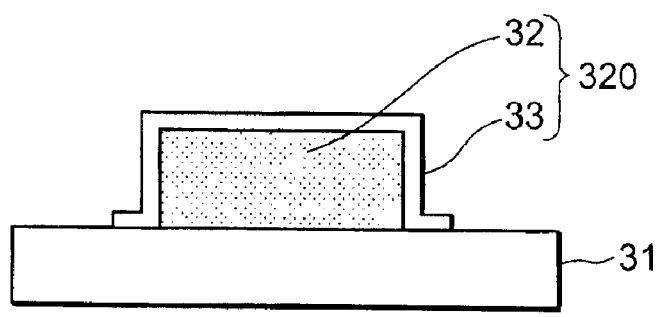
FIG. 5 is a cross-sectional view of a SAW device according to a third preferred embodiment of the present invention.

FIG. 5 is a cross-sectional view of an IDT electrode 320 of a SAW device according to a third preferred embodiment of the present invention. As shown in FIG. 5, the IDT electrode 320 having a metal film 32, a thin metal film 33 which is formed on the metal film 32, is formed on a piezoelectric substrate (e.g., LiTaO$_3$) 31. The metal film 32 is an aluminum alloy including copper (Cu) of 1 weight percent. The thin metal films 33 are, for example, titanium (Ti), a thickness of the thin metal films 33 is about 150 Å. Titanium (Ti) is higher density than a conventional inorganic protection film (e.g., SiO$_2$).

Figure 6A:
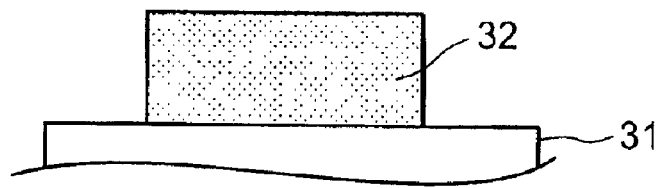
FIGS. 6(a) through 6(d) are cross-sectional views showing a method of manufacturing the SAW device according to the third preferred embodiment of the present invention.

FIGS. 6(a) through 6(d) are cross-sectional views showing a method of manufacturing the IDT electrode 320 of the SAW device according to the second preferred embodiment of the present invention. As shown in FIG. 6(a), the metal film 32, for example, an aluminum alloy film 32 including copper (Cu) of 1 weight percent is formed on the piezoelectric substrate 31 by a magnetron sputtering method. Then, the metal film 32 as an IDT electrode pattern is formed by a photolithography etching method.

Figure 6B:
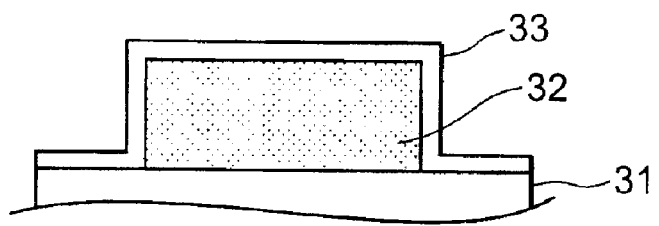

Next, as shown in FIG. 6(b), the thin metal film 33 having a thickness of about 150 Å is formed on the metal film 32 by the magnetron sputtering method.

Figure 6C:
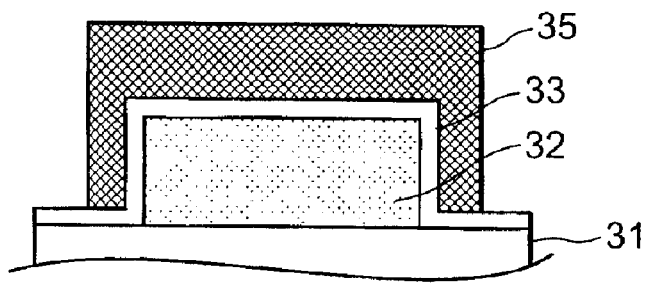

Next, as shown in FIG. 6(c), a resist film 35 is formed on the thin metal film 33. The resist film 35 completely covers a region of the thin metal film 32 which is located on the metal film 32.

Figure 6D:
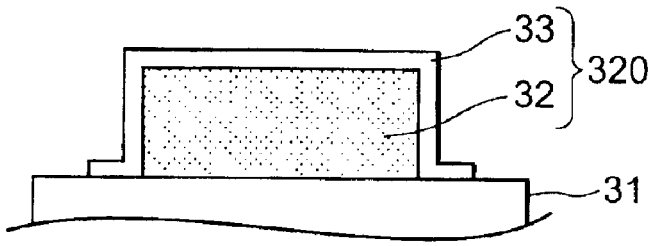

Next, as shown in FIG. 6(d), an etching of the thin metal film 32 is performed by using the resist film 35 as a mask. As a result, the IDT electrode 320 which has the thin metal film 33 covering the metal film 32, is formed.

According to the third preferred embodiment of the present invention, the IDT electrode 320 can be formed by a simple manufacturing process step.

Figure 7A:
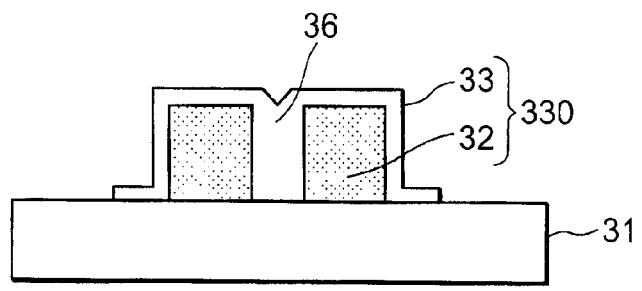
FIGS. 7(a) and 7(b) are cross-sectional views and FIG. 7(c) is a plan view of a SAW device according to a fourth preferred embodiment of the present invention.
Figure 7B:
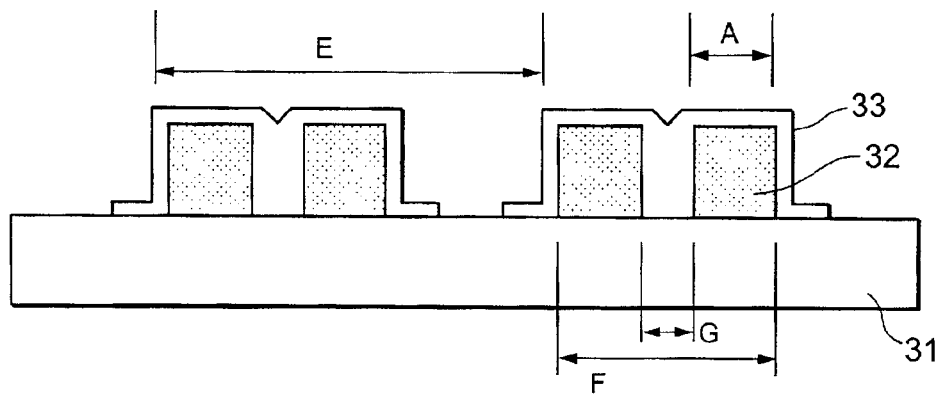
Figure 7C:
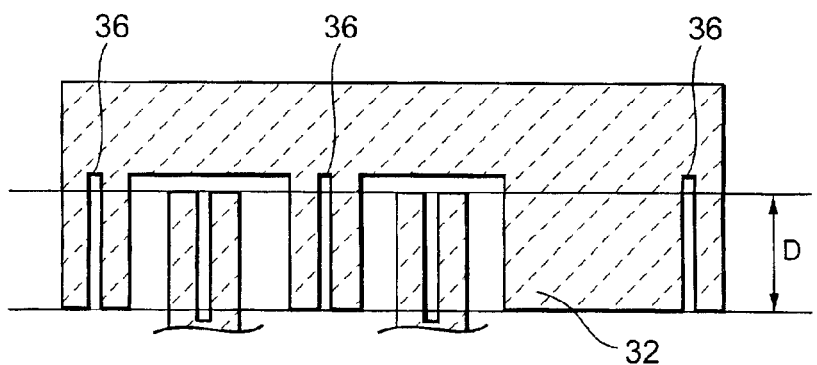

FIGS. 7(a) and 7(b) are cross-sectional views and FIG. 7(c) is a plan view of an IDT electrode 330 of a SAW device according to a fourth preferred embodiment of the present invention. As shown in FIG. 7(a), the IDT electrode 330 having a metal film 32 which includes slits 36, a metal film 33 which are formed on the metal film 32 and in the slits 36, is formed on a piezoelectric substrate (e.g., LiTaO$_3$) 31. The metal film 32 is an aluminum alloy including copper (Cu) of 1 weight percent. The metal films 33 are, for example, titanium (Ti), a thickness of the thin metal films 33 is about 150 Å. Titanium (Ti) is higher density than a conventional inorganic protection film (e.g., SiO$_2$).

As shown in FIG. 7(b), the metal film 32 is divided into two pieces having a width A, by the slit 36 having a width G. A width F of the metal film 32 is, for example, 1.2 μm, and the width G of the slit 36 is, for example, 0.4 μm, when the IDT electrode 330 is used to the SAW device having a center frequency of 800 MHz band. At this time, a pitch E of the IDT electrode 330 is, for example, 2.4 μm.

And, as shown in FIG. 7(c), the slits 36 minimum require an overlap length D with one of the IDT electrode 330 extending to a first direction and the other of the IDT electrode 330 extending to a second direction which is opposite from the first direction.

Figure 8A:
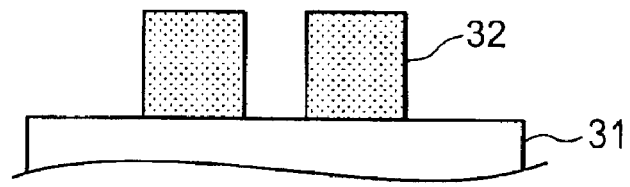
FIGS. 8(a) through 8(d) are cross-sectional views showing a method of manufacturing the SAW device according to the fourth preferred embodiment of the present invention.

FIGS. 8(a) through 8(d) are cross-sectional views showing a method of manufacturing the IDT electrode 330 of the SAW device according to the fourth preferred embodiment of the present invention. As shown in FIG. 8(a), the metal film 32, for example, an aluminum alloy film 32 including copper (Cu) of 1 weight percent is formed on the piezoelectric substrate 31 by a magnetron sputtering method. Then, the metal film 32 as an IDT electrode pattern is formed by a photolithography etching method. Then, the metal electrode 32 is divided into two pieces, by the slits 36. The slits 36 extend an orthogonal direction to a propagation direction of the surface acoustic wave. In the fourth preferred embodiment, the length D of the slits 36 is 0.4 μm.

Figure 8B:
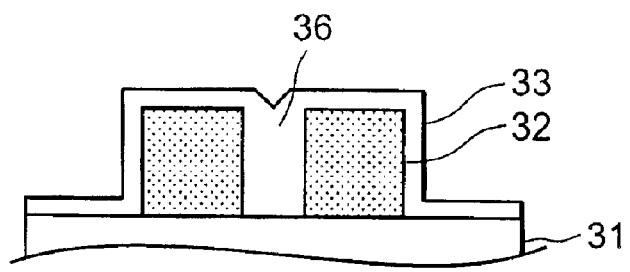

Next, as shown in FIG. 8(b), the metal film 33 having a thickness of about 1000 Å is formed on the metal film 32 by the magnetron sputtering method. At this time, the slits 36 are embedded by the metal film 33.

Figure 8C:
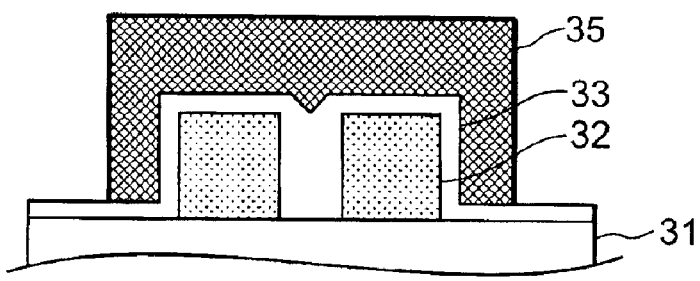

Next, as shown in FIG. 8(c), a resist film 35 is formed on the metal film 33. The resist film 35 completely covers a region of the thin metal film 33 which is located on the metal film 32.

Figure 8D:
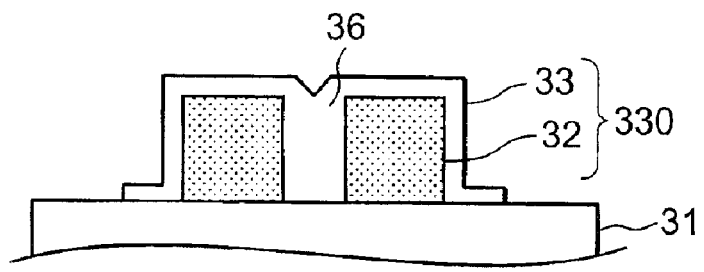

Next, as shown in FIG. 8(d), an etching of the metal film 32 is performed by using the resist film 35 as a mask. As a result, the IDT electrode 330 which has the thin metal film 33 covering the metal film 32, is formed.

According to the fourth preferred embodiment of the present invention, since the slit 36 extending an orthogonal direction to a propagation direction of the surface acoustic wave is formed in the metal film 32, a movement of aluminum atoms in the metal film 32 can be effectively inhibited. As a result, an occurrence of hillocks in the metal film 32, and more particularly, the hillocks occurring in a vertically to the slits 36, can be inhibited.

Figure 9A:
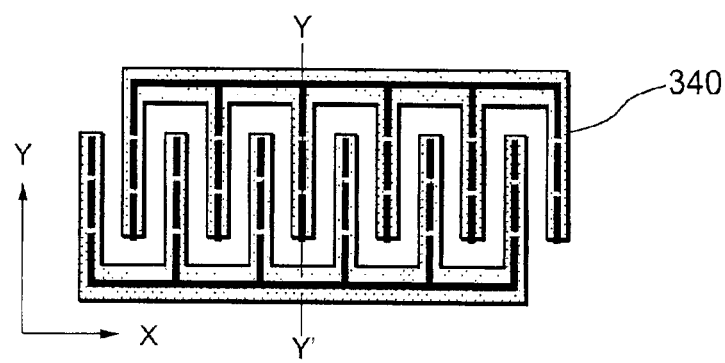
FIG. 9(a) is a plan view and FIGS. 9(b) and 9(c) are cross-sectional views of a SAW device according to a fifth preferred embodiment of the present invention.
Figure 9B:
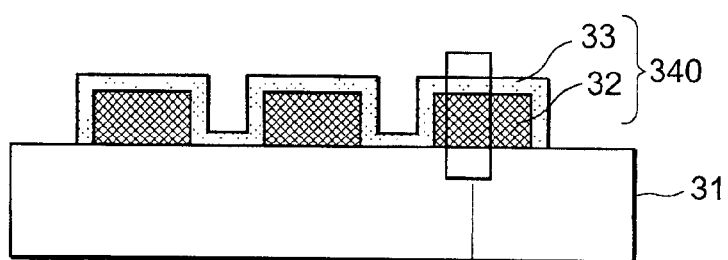
Figure 9C:
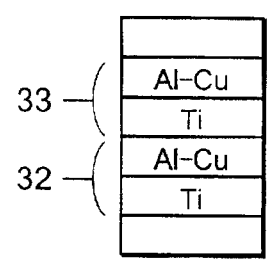

FIG. 9(a) is a plan view and FIGS. 9(b) and 9(c) are cross-sectional views of an IDT electrode 340 of a SAW device according to a fifth preferred embodiment of the present invention. Specifically, FIGS. 9(b) and 9(c) show cross-sectional views along the line Y–Y' in FIG. 9(a) though FIGS. 1 through 8 show cross-sectional views in a X direction in FIG. 9(a).

As shown in FIGS. 9(a) and 9(b), the IDT electrode 340 having a metal film 32 and a thin metal film 33 is formed on a piezoelectric substrate (e.g., LitaO$_3$) 31. The metal film 32 is consisted of a plurality of dot patterns extending to a Y direction in series. And, the thin metal film 33 is formed on the metal film 32 and between adjacent dot patterns to the Y direction.

And, as shown in FIG. 9(c), the metal film 32 includes a titanium film Ti and an aluminum-copper alloy film Al—Cu which is formed on the titanium film Ti. Similarly, the thin metal film 33 includes a titanium film Ti and an aluminum-copper alloy film Al—Cu which is formed on the titanium film Ti. Specifically, FIGS. 10(b) shows a cross-sectional views along the line Y–Y' in FIG. 10(a), and FIG. 10(d) shows a cross-sectional views along the line Y–Y' in FIG. 10(c).

Figure 10A:
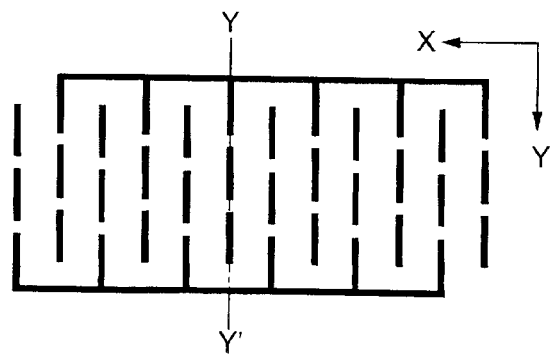
FIGS. 10(a) and 10(c) are plan views and FIGS. 10(b) and 10(d) are cross-sectional views of the SAW device according to the fifth preferred embodiment of the present invention.
Figure 10B:
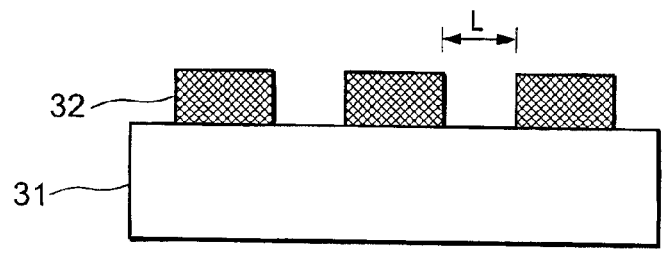
Figure 10C:
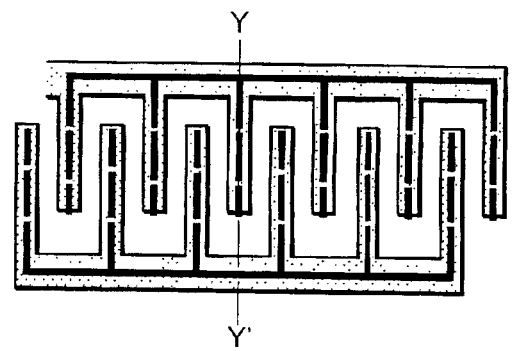
Figure 10D:
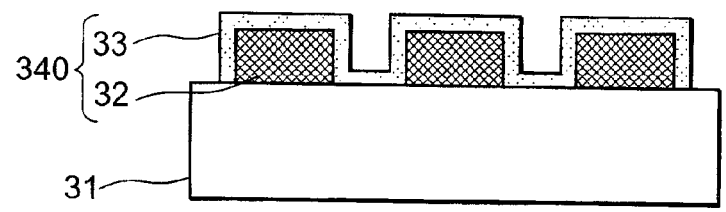

FIGS. 10(a) and 10(c) are plan views and FIGS. 10(b) and 10(d) are cross-sectional views showing a method of manufacturing the IDT electrode 340 of the SAW device according to the fifth preferred embodiment of the present invention.

As shown in FIGS. 10(a) and 10(b), the metal film 32 having the titanium film Ti and the aluminum-copper alloy film Al—Cu which is formed on the titanium film Ti, is formed on the piezoelectric substrate 31 by a magnetron sputtering method. Then, the metal film 32 as an IDT electrode pattern is formed by a photolithography etching method. As above mentioned, the metal film 32 is consisted of the plurality of dot patterns extending to the Y direction in series, and a distance between the adjacent dot patterns to the Y direction is about 0.5 μm.

Next, as shown in FIGS. 10(c) and 10(d), the thin metal film 33 having the titanium film Ti and the aluminum-copper alloy film Al—Cu which is formed on the titanium film Ti, is formed on the metal film 32 and adjacent between the dot patterns to the Y direction by the magnetron sputtering method. At this time, a thickness of the titanium film Ti is about 150 Å, and a thickness of the aluminum-copper alloy film Al—Cu is about 1000 Å. Then, similarly to the fourth preferred embodiment, a resist film is formed on the metal film 33. The resist film completely covers a region of the thin metal film 33 which is located on the metal film 32. Next, similarly to the fourth preferred embodiment, an etching of the metal film 32 is performed by using the resist film as a mask. As a result, the IDT electrode 340 which has the thin metal film 33 covering the metal film 32, is formed.

According to the fifth preferred embodiment of the present invention, since the metal film 32 is consisted of a plurality of dot patterns extending to the Y direction, a movement of aluminum atoms in the metal film 32 can be inhibited. As a result, an occurrence of hillocks and voids in the metal film 32 can be inhibited.

While the first through fifth preferred embodiments of the present invention presents an example in which a conductive film is used as the metal film 33, the present invention is not limited to this example and an oxide film of the conductive film or a nitride film of the conductive film may be used as the metal film 33.

Figure 11A:
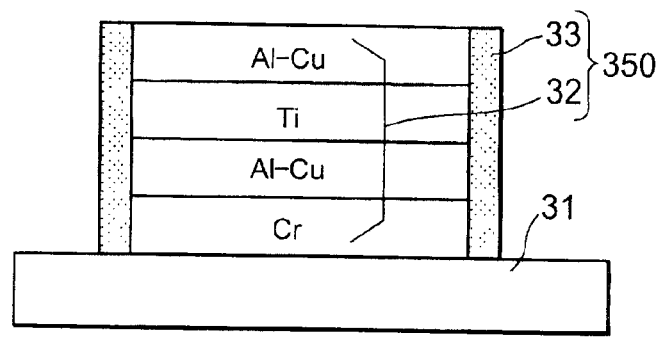
FIGS. 11(a) through 11(c) are cross-sectional views of a SAW device according to a sixth preferred embodiment of the present invention.
Figure 11B:
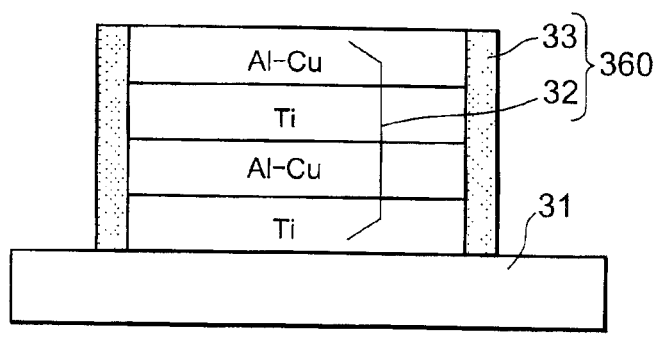
Figure 11C:
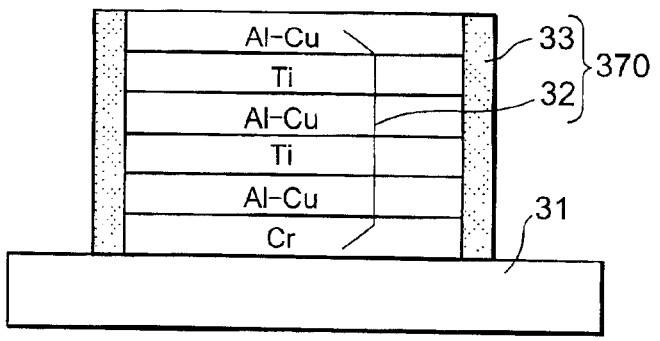

FIGS. 11(a) through 11(c) are cross-sectional views of various IDT electrodes 350, 360 and 370 according to a sixth preferred embodiment of the present invention.

As shown in FIG. 11(a), the IDT electrode 350 having a metal film 32 and thin metal films 33 which are formed on both side walls of the metal film 32, is formed on is a piezoelectric substrate (e.g., LiTaO₃) 31. The metal film 32 is consisted of a chromium film Cr, a first aluminum-copper alloy film Al—Cu which is formed on the chromium film Cr, a titanium film Ti which is formed on the first aluminum-copper alloy film Al—Cu and a second aluminum-copper alloy film Al—Cu which is formed on the titanium film Ti. A thickness of the chromium film Cr is about 150 Å, a thickness of the first and second aluminum-copper alloy films Al—Cu is about 1725 Å, and a thickness of the titanium film Ti is about 100 Å, when the IDT electrode 350 is used to the SAW device having a center frequency of 800 MHz through 850 MHz band. A dry etching speed of the chromium film Cr is later than a dry etching speed of the aluminum-copper alloy films Al—Cu. Specifically, the dry etching speed of the chromium film Cr accounts for about 5% of the dry etching speed of the aluminum-copper alloy films Al—Cu.

Commonly, since the dry etching speed of the aluminum-copper alloy films Al—Cu and the titanium film Ti is very high, sometime the piezoelectric substrate 31 is damaged due to such a dry etching. Therefore, since the chromium film Cr is formed on the piezoelectric substrate 31, a damage of the piezoelectric substrate 31 can be inhibited. The chromium film Cr is removed by a wet etching using a chemical whom the basis of the chemical is an ammonium and second cerium nitrate. Or, the chromium film Cr is removed by a dry etching such that the dry etching condition shows a low damage for the piezoelectric substrate 31.

According to the sixth preferred embodiment of the present invention, a damage of the piezoelectric electrode 31 due to a dry etching can be inhibited. More further, since the chromium film Cr is formed on the piezoelectric substrate 31, an adhesion between the IDT electrode 350 and the piezoelectric substrate 31 can be improved.

While the sixth preferred embodiment of the present invention presents an example in which the chromium film Cr is formed on the piezoelectric substrate 31, the present invention is not limited to this example, and as shown in FIG. 11(b), a titanium film Ti may be formed on the piezoelectric substrate 31. Therefore, an orientation of aluminum atoms can be improved.

Further, as shown in FIG. 11(c), an IDT electrode 370 having a metal film 32 which further includes a second titanium Ti formed on the second aluminum-copper alloy film Al—Cu and a third aluminum-copper alloy film Al—Cu formed on the second titanium film Ti, may be formed on the piezoelectric substrate 31. Therefore, a withstand voltage property of the IDT electrode 370 can be improved.

Figure 12:
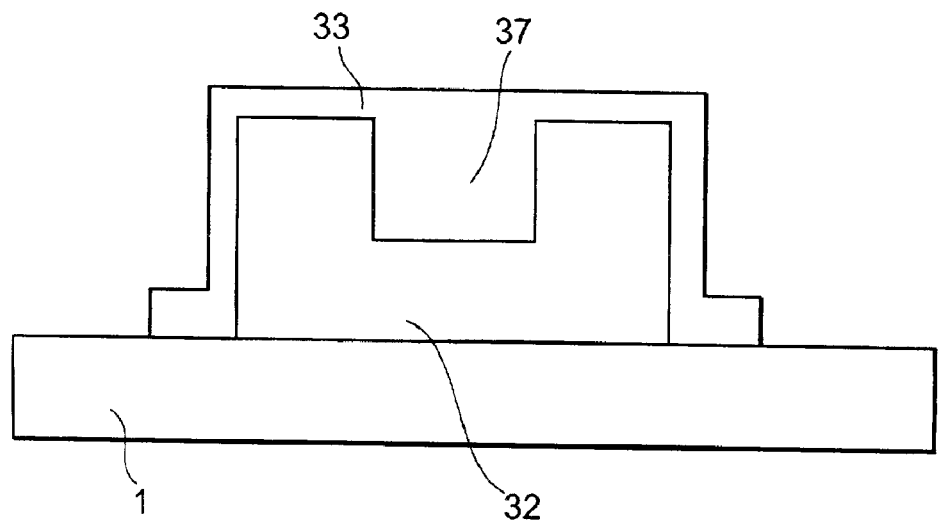
FIG. 12 is a cross-sectional view of a SAW device according to a seventh preferred embodiment of the present invention.
Figure 13:
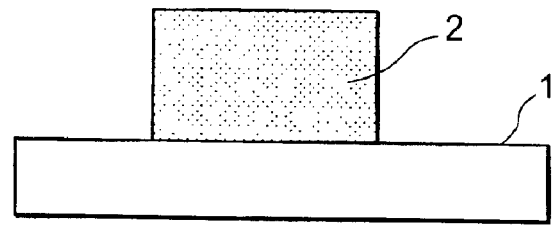
FIG. 13 is a cross-sectional view of a conventional SAW device.
Figure 14:
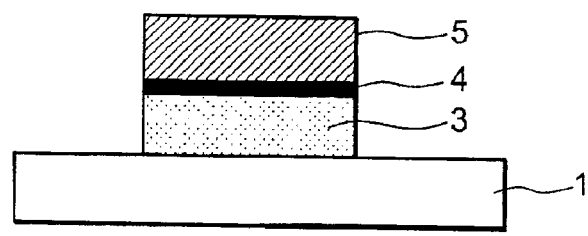
FIG. 14 is a cross-sectional view of another conventional SAW device.

Further, while the fourth preferred embodiment of the present invention presents an example in which the slit 36 is formed in the metal film 32, the present invention is not limited to this example and a trench 37 may be formed in the metal film 32, as shown in FIG. 12.

As described above, according to the SAW device and the method of manufacturing the SAW device of the present invention, a movement of aluminum atoms in an IDT electrode can be inhibited, occurrences of hillocks and voids in the IDT electrode can be inhibited. Therefore, a propagation property of a surface acoustic wave can be improved significantly than a propagation property of a prior art. More further, the SAW device and the method of manufacturing the SAW device according to the present invention can improve a withstand voltage property of the IDT electrode.

The present invention has been described with reference to illustrative embodiments, however, this invention must not be considered to be confined only to the embodiments illustrated. Various modifications and changes of these illustrative embodiments and the other embodiments of the present invention will become apparent to those skilled in the art with reference to the description of the present invention. It is therefore contemplated that the appended claims will cover any such modifications or embodiments as fall within the true scope of the invention.

Further, the present invention may include the following methods:

A method of manufacturing a surface acoustic wave (SAW) device which is formed in a piezoelectric substrate comprising:

forming a first film of a first metal formed over the piezoelectric substrate;

forming second films of a second metal formed over opposite side walls of the first film, respectively, and wherein the second metal is different from the first metal.

The method of manufacturing the SAW device according to the above, further comprises:

forming a metal film including a chromium between the first film and the piezoelectric substrate.

The method of manufacturing the SAW device according to the above, further comprising:

forming an alloy film including the first and second metals between the first and second films.

The method of manufacturing the SAW device according to the above, wherein the forming the alloy film is performed by annealing the first and second films in a nitride gas atmosphere.

A method of manufacturing a surface acoustic waveform (SAW) device which is formed in a piezoelectric substrate comprising:

forming a first film of a first metal over the piezoelectric substrate;

forming a second film of a second metal over the first film, wherein the second metal is different from the first metal.

The method of manufacturing the SAW device according to the above, wherein the first film is completely covered by the second film and the piezoelectric substrate.

The method of manufacturing the SAW device according to the above, further comprising:

forming a slit in the first film, wherein the slit exposes a surface of the piezoelectric substrate and extends an orthogonal direction to a propagation direction of a surface acoustic wave.

The method of manufacturing the SAW device according to the above, further comprising:

forming a trench in the first film, wherein the trench extends an orthogonal direction to a propagation direction of a surface acoustic wave.

The method of manufacturing the SAW device according to the above, further comprising:

forming a metal film including a chromium between the first film and the piezoelectric substrate.

The method of manufacturing the SAW device according to the above, further comprising:

forming an alloy film including the first and second metals between the first and second films.

The method of manufacturing the SAW device according to the above, wherein the forming the alloy film is performed by annealing the first and second films in a nitride gas atmosphere.

A method of manufacturing a SAW device which is formed in a piezoelectric substrate comprising:

forming a first film of a first metal over the piezoelectric substrate which includes a plurality of dot patterns, wherein the dot patterns extend an orthogonal direction to a propagation direction of a surface acoustic wave in series;

forming second films of a second metal over each side walls of the plurality of the dot patterns, wherein the second metal is different from the first metal.

The method of manufacturing the SAW device according to the above, further comprising:

forming a metal film including a chromium between the first film and the piezoelectric substrate.

The method of manufacturing the SAW device according to the above, further comprising:

forming an alloy film including the first and second metals between the first and second films.

The method of manufacturing the SAW device according to the above, wherein the forming the alloy film is performed by annealing the first and second films in a nitride gas atmosphere.

A method of manufacturing a surface acoustic wave (SAW) device which is formed in a piezoelectric substrate comprising:

forming a first film of a firs metal over the piezoelectric substrate which includes a plurality of dot patterns, wherein the dot patterns extend an orthogonal direction to a propagation direction of a surface acoustic wave in series;

forming a second film of a second metal over the first film, wherein the second metal is different from the first metal.

The method of manufacturing the SAW device according to the above, further comprising:

forming a metal film including a chromium between the first film and the piezoelectric substrate.

The method of manufacturing the SAW device according to the above, further comprising:

forming an alloy film including the first and second metals between the first and second films.

The method of manufacturing the SAW device according to the above, wherein the forming the alloy film is performed by annealing the first and second films in a nitride gas atmosphere.

What is claimed is:

1. A surface acoustic wave (SAW) device comprising:

a piezoelectric substrate; and an electrode having a first film of a first metal formed over the piezoelectric substrate, and second films of a second metal formed over opposite side walls of the first film, wherein the second metal is different from the first metal, and wherein an upper surface of the first film is not covered by the second films.

2. The SAW device according to claim 1, wherein the electrode converts an incident electronic signal into a surface acoustic wave, and converts an incident surface acoustic wave into an electronic signal.

3. The SAW device according to claim 1, further comprising:

a metal film including chromium formed between the first film and the piezoelectric substrate.

4. The SAW device according to claim 1, further comprising:

an alloy film including the first and second metals, which is formed between the first and second films.

5. The SAW device according to claim 1, wherein the first film is formed of two different metal films.

6. The SAW device according to claim 5, wherein the metal films include titanium and aluminum, respectively.

7. A surface acoustic wave (SAW) device comprising:

a piezoelectric substrate;

an electrode having a first film of a first metal formed over the piezoelectric substrate, and second films of a second metal formed over opposite side walls of the first film, wherein the second metal is different from the first metal; and a metal film including chromium formed between the first film and the piezoelectric substrate.

8. A surface acoustic wave (SAW) device comprising:

a piezoelectric substrate;

an electrode having a first film of a first metal formed over the piezoelectric substrate, and second films of a second metal formed over opposite side walls of the first film, wherein the second metal is different from the first metal; and an alloy film including the first and second metals, which is formed between the first and second films.

9. A surface acoustic wave (SAW) device comprising:

a piezoelectric substrate; and an electrode having a first film of a first metal formed over the piezoelectric substrate, and second films of a second metal formed over opposite side walls of the first film, wherein the second metal is different from the first metal, wherein the first film is formed of two different metals.

10. The SAW device according to claim 9, wherein the two different metals include titanium and aluminum, respectively.

* * * * *